United States Patent
Liu et al.

(10) Patent No.: US 10,269,711 B1
(45) Date of Patent: Apr. 23, 2019

(54) SEMICONDUCTOR DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Ming-Chyi Liu, Hsinchu (TW); Chia-Shiung Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/923,562

(22) Filed: Mar. 16, 2018

(51) Int. Cl.
| | | |
|---|---|---|
| H01L 23/528 | (2006.01) |
| H01L 27/08 | (2006.01) |
| H01L 21/768 | (2006.01) |
| H01L 29/06 | (2006.01) |
| H01L 29/66 | (2006.01) |
| H01L 23/522 | (2006.01) |

(52) U.S. Cl.
CPC .... H01L 23/5283 (2013.01); H01L 21/76897 (2013.01); H01L 23/5226 (2013.01); H01L 27/0814 (2013.01); H01L 29/0692 (2013.01); H01L 29/66136 (2013.01)

(58) Field of Classification Search
CPC ............. H01L 23/5283; H01L 23/5226; H01L 29/66136; H01L 29/0692; H01L 21/76897; H01L 27/0814
See application file for complete search history.

(56) References Cited

U.S. PATENT DOCUMENTS

2006/0205169 A1* 9/2006 Yoon .................. H01L 29/6653
438/303

* cited by examiner

Primary Examiner — Anthony Ho
(74) Attorney, Agent, or Firm — WPAT, P.C., Intellectual Property Attorneys; Anthony King

(57) ABSTRACT

A semiconductor device includes a substrate, a group of devices, a plurality of sidewall spacers and a contact structure. The group of the devices is arranged over the substrate. The plurality of sidewall spacers are over lateral surfaces of the group of the devices. The sidewall spacers abut one another and cooperatively define an enclosure between the devices. The contact structure is arranged between the devices in the enclosure. The contact structure is electrically connected to one device of the group of the devices.

20 Claims, 17 Drawing Sheets

SEMICONDUCTOR DEVICE AND METHOD FOR MANUFACTURING THE SAME

BACKGROUND

Optoelectronic devices such as light emitting devices or light receiving devices are widely used in various electronic products such as displays, digital cameras or the like. Compared to memory device, the top of the optoelectronic device is exposed to allow propagation of light, which increases the difficulty in formation of top contact via.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
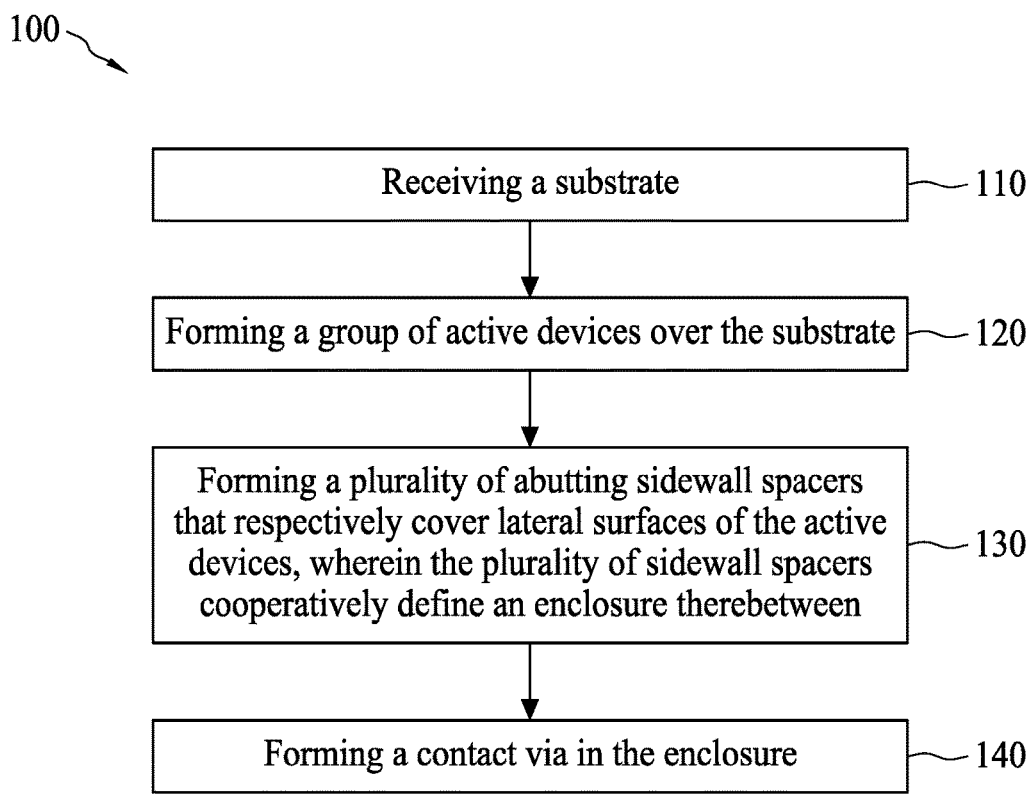
FIG. 1 is a flow chart illustrating a method for manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In one or more embodiments of the present disclosure, a semiconductor device uses self-aligned contact via(s) to provide an electrical connection path between an active device and a circuitry. The contact via is formed in an enclosure defined by sidewall spacers of several neighboring active devices, and thus can be formed in a self-aligned manner. The self-aligned contact via can reduce the number of photomasks in the fabrication of the semiconductor device, and thus layout density can be increased, and manufacturing costs can be reduced.

FIG. 1 is a flow chart illustrating a method for manufacturing a semiconductor device according to various aspects of one or more embodiments of the present disclosure. The method 100 begins with operation 110 in which a substrate is received. The method 100 proceeds with operation 120 in which a group of active devices is formed over the substrate. The method 100 continues with operation 130 in which a plurality of abutting sidewall spacers that respectively cover lateral surfaces of the active devices of the group of the active devices, wherein the plurality of sidewall spacers cooperatively define an enclosure therebetween. The method 100 proceeds with operation 140 in which a contact via is formed in the enclosure.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
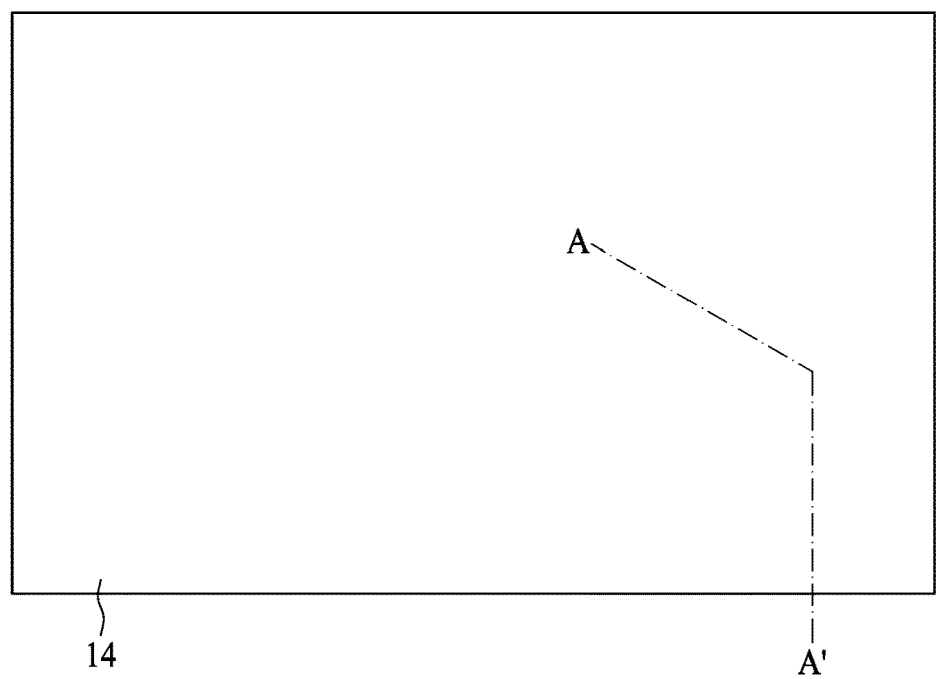
FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A and FIG. 11B are schematic views at one of various operations of manufacturing a semiconductor device according to one or more embodiments of the present disclosure.
Figure 2B:
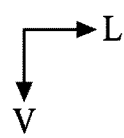
Figure 2B:
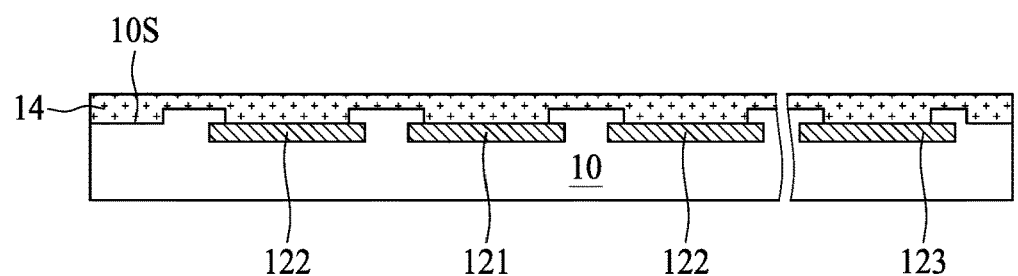

FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A and FIG. 11B are schematic views at one of various operations of manufacturing a semiconductor device according to one or more embodiments of the present disclosure, wherein FIG. 2A, FIG. 3A, FIG. 4A, FIG. 5A, FIG. 6A, FIG. 7A, FIG. 8A, FIG. 9A, FIG. 10A and FIG. 11A are top views at one of various operations of manufacturing a semiconductor device according to one or more embodiments of the present disclosure, and FIG. 2B, FIG. 3B, FIG. 4B, FIG. 5B, FIG. 6B, FIG. 7B, FIG. 8B, FIG. 9B, FIG. 10B and FIG. 11B are cross-sectional views along line A-A' at one of various operations of manufacturing a semiconductor device according to one or more embodiments of the present disclosure. Referring to FIG. 2A and FIG. 2B, a substrate such as a semiconductor substrate 10 is received. The semiconductor substrate 10 may include a bulk substrate, or a composite substrate. In some embodiments, the material of the semiconductor substrate 10 may comprise elementary semiconductor such as silicon or germanium. In some embodiments, the material of the semiconductor substrate 10 may include a compound semiconductor such as III-V compound semiconductor. By way of example, the III-V compound semiconductor may include gallium arsenic (GaAs), gallium phosphide (GaP), indium phosphide (InP), indium arsenide (InAs), other III-V compound semiconductors, or a combination thereof. In some embodiments, the semiconductor substrate 10 may be doped, or un-doped. The semiconductor substrate 10 includes a major surface 10S on which devices such as active devices, passive devices or the like are formed.

In some embodiments, driving devices such as metal-oxide semiconductor (MOS) transistors (not shown) may be formed over the major surface 10S of the semiconductor substrate 10. In some embodiments, an interconnection layer (not shown) including one or more metal layers and one or more inter-dielectric layers may be formed over the semiconductor substrate 10. In some embodiments, a plurality of conductive pads such as first conductive pads 121, second conductive pads 122 and bonding pads 123 (not shown in top views) may be formed over the semiconductor substrate 10, and electrically connected to the driving devices through the interconnection layer. The first conductive pads 121 and the second conductive pads 122 may be formed in an active region of the semiconductor substrate 10, and configured to be electrically connected to active devices to be formed. The bonding pads 123 may be formed in a peripheral region of the semiconductor substrate 10, and configured to be electrically connected to external electronic component such as printed circuit board (PCB) or the like.

In some embodiments, an insulative layer 14 such as an organic insulative layer or an inorganic insulative layer, covering the first conductive pads 121, the second conductive pads 122 and the bonding pads 123 is formed over the semiconductor substrate 10. Examples of the material of the insulative layer 14 may include polyimide, or the like.

Figure 3A:
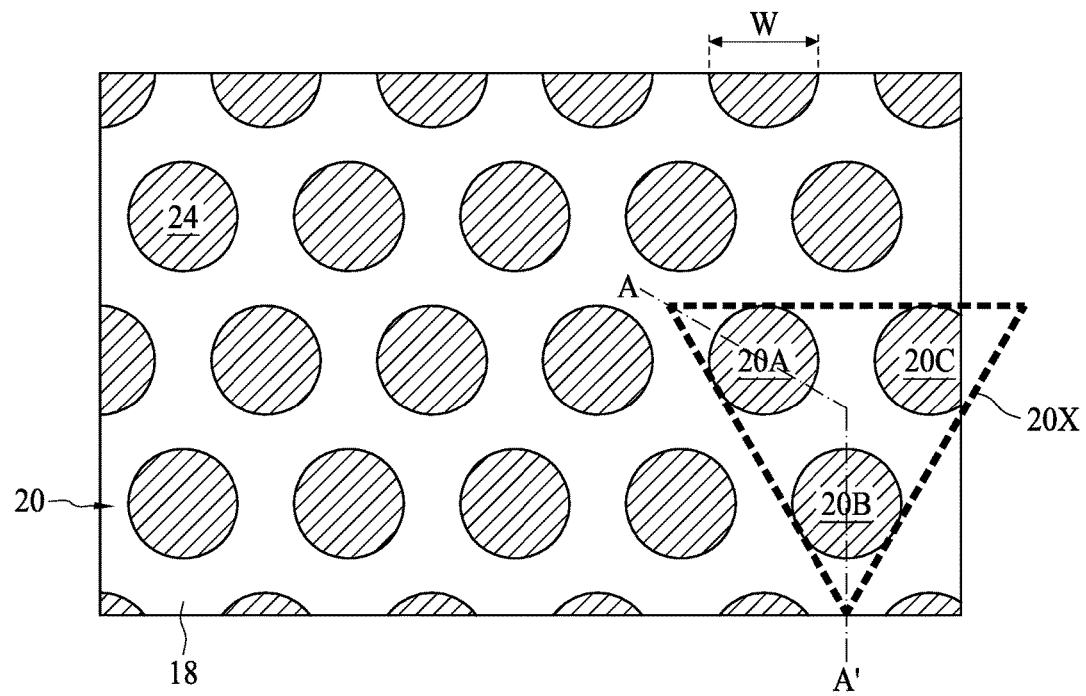
Figure 3B:
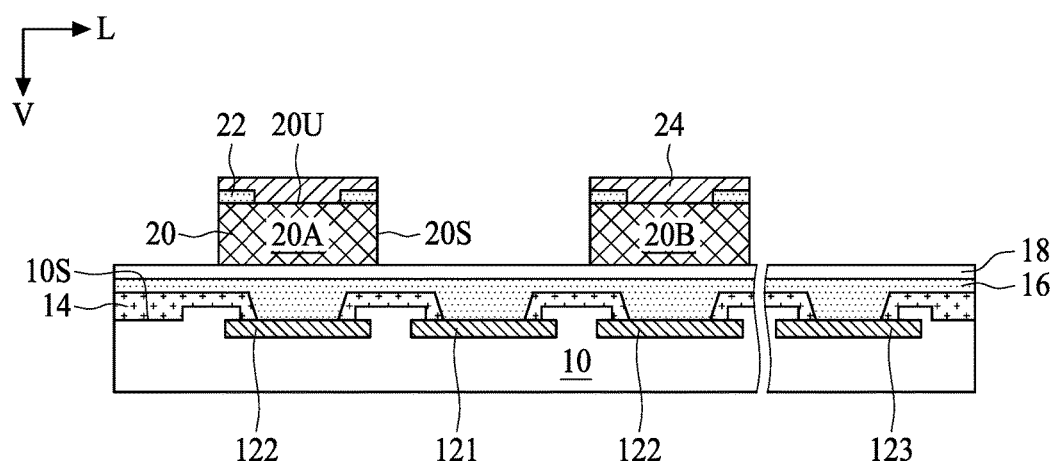

Referring to FIG. 3A and FIG. 3B, the insulative layer 14 is patterned to expose the first conductive pads 121, the second conductive pads 122 and the bonding pads 123. By way of example, the insulative layer 14 may include a photosensitive material, and patterned by photolithography operation. In some other embodiments, the insulative layer 14 may be patterned by etching operation. In some embodiments, one or more conductive layers may be formed over the insulative layer 14, and configured to serve as bottom electrodes. For example, a first conductive layer 16 may be formed over the insulative layer 14, and electrically connected to the first conductive pads 121, the second conductive pads 122 and the bonding pads 123 exposed from the insulative layer 14. A second conductive layer 18 may be formed over, and electrically connected to the first conductive layer 16. In some embodiments, the materials of the first conductive layer 16 and the second conductive layer 18 may include metal such as aluminum, copper or the like. The first conductive layer 16 can be configured as bottom second contact structures 50 after being patterned. The second conductive layer 18 can be configured as a conductive bonding layer. After being patterned, the first conductive layer 16 and the second conductive layer 18 may be configured as bottom electrodes.

A plurality of devices are formed over the second conductive pads 122, and electrically connected to the second conductive pads 122 through the second conductive layer 18 and the first conductive layer 16. In some embodiments, the devices include active devices 20 such as diode devices. The active device 20 may include a plurality of doped semiconductor films with a p-n junction, a p-i-n junction or the like. In some embodiments, the active device 20 may include an optoelectronic device such as a diode device. The diode device may include light receiving device able to sense light, or a light emitting device able to emit light. In some embodiments, the active device 20 may be a mesa diode device, which may include a substantially tubular profile with a substantially circular planar cross-section in a lateral direction L parallel to the major surface 10S. In some embodiments, a width W of the active device 20 measured along the lateral direction L is ranging from about 1 to about 100 micrometers, but is not limited thereto. The active device 20 includes a lateral surface 20S. In some embodiments, the lateral surface 20S may be substantially perpendicular to the major surface 10S of the semiconductor substrate 10. Alternatively, the lateral surface 20S of the active device 20 may be inclined with respect to the major surface 10S of the semiconductor substrate 10.

A top electrode 22 may be formed over an upper surface 20U of the active device 20. In some embodiments, the top electrode 22 may be a patterned electrode such that the upper surface 20U of the active device 20 may be exposed from the top electrode 22. By way of example, the top electrode 22 may be a ring-shaped electrode such that the upper surface 20U of the active device 20 is exposed to allow light propagation. In some embodiments, a sacrificial layer 24 such as a hard mask layer may be formed over the active device 20 to cover and protect the upper surface 20U and the top electrode 22 during fabrication.

In some embodiments, the number of the first conductive pads 121 may be the same as the number of the active devices 20. For example, one first conductive pad 121 may be disposed at a side of the respective active device 20.

The plurality of active devices 20 may be categorized into a plurality of groups 20X of active devices 20 arranged over the semiconductor substrate 10. For example, each group 20X of the active devices 20 includes three active devices 20A, 20B and 20C arranged as a triangle. In some alternative embodiments, each group 20X of the active devices 20 may include four or more active devices.

Figure 4A:
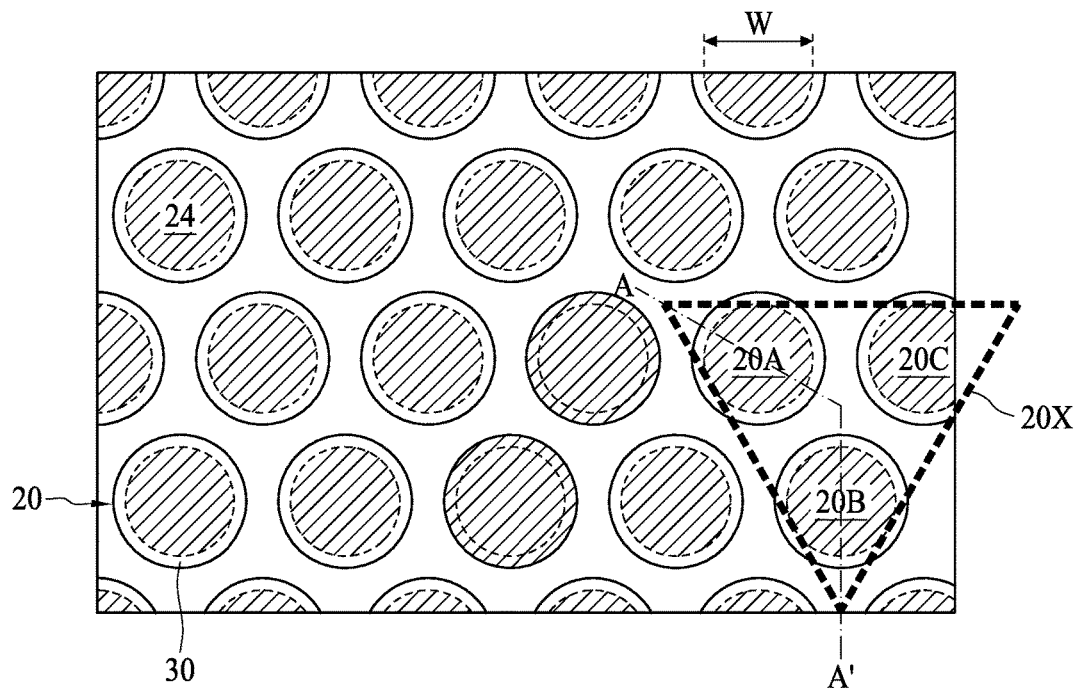
Figure 4B:
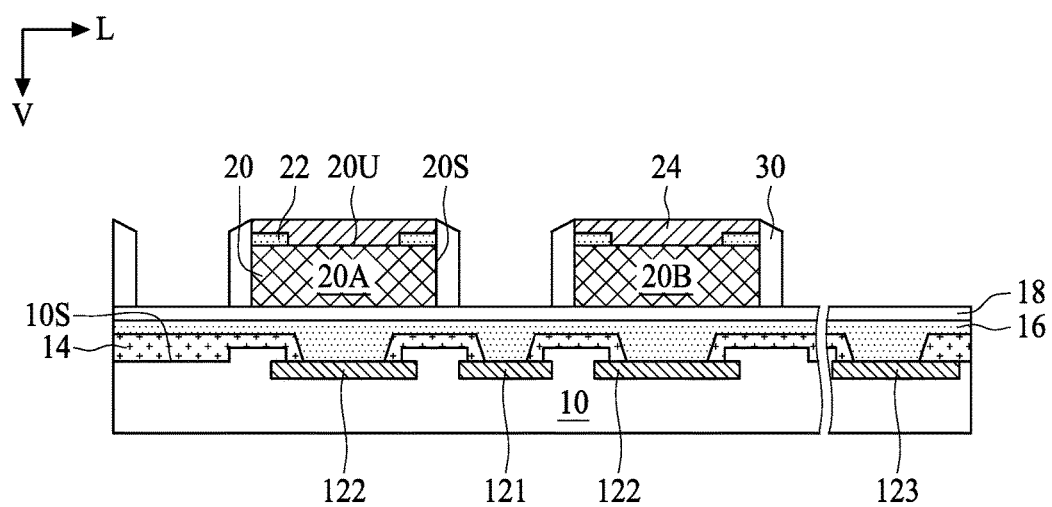

A plurality of sidewall spacers 34 are formed over the semiconductor substrate 10, covering the lateral surfaces 20S of the plurality of active devices 20, respectively. In some embodiments, the sidewall spacer 34 may include a stack of dielectric layers stacked over one another, and an example of fabrication for the sidewall spacer is illustrated through FIG. 4A, FIG. 4B, FIG. 5A, FIG. 5B, FIG. 6A and FIG. 6B. Referring to FIG. 4A and FIG. 4B, a plurality of first sidewall spacers 30 covering the lateral surfaces 20S of the plurality of active devices 20 are formed. In some embodiments, the first sidewall spacers 30 may be formed by forming a dielectric material over the semiconductor substrate 10 and the active device 20. The dielectric material may be then etched back to form the first sidewall spacers 30, and photolithography operation may be omitted. The material of the first sidewall spacer 30 may include, but is not limited to, oxides such as silicon oxide and/or hafnium oxide, nitrides such as silicon nitride, oxynitride such as silicon oxynitride, or the like. The first spacer structure 30 may have a thinner thickness so as to substantially follow the profile of the active device 20. In some embodiments, the thickness of the first sidewall spacer 30 measured along the lateral direction L substantially parallel to the major surface 10S of the semiconductor substrate 10 is ranging from about 100 angstroms to about 3 micrometers, but the thickness is not limited thereto.

Figure 5A:
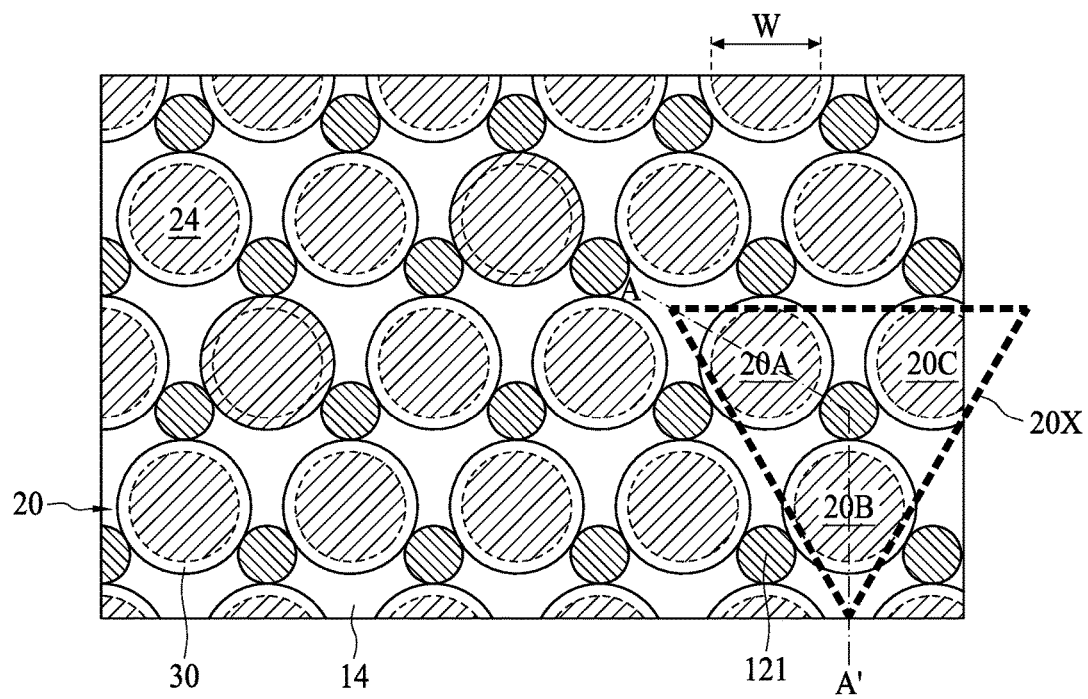
Figure 5B:
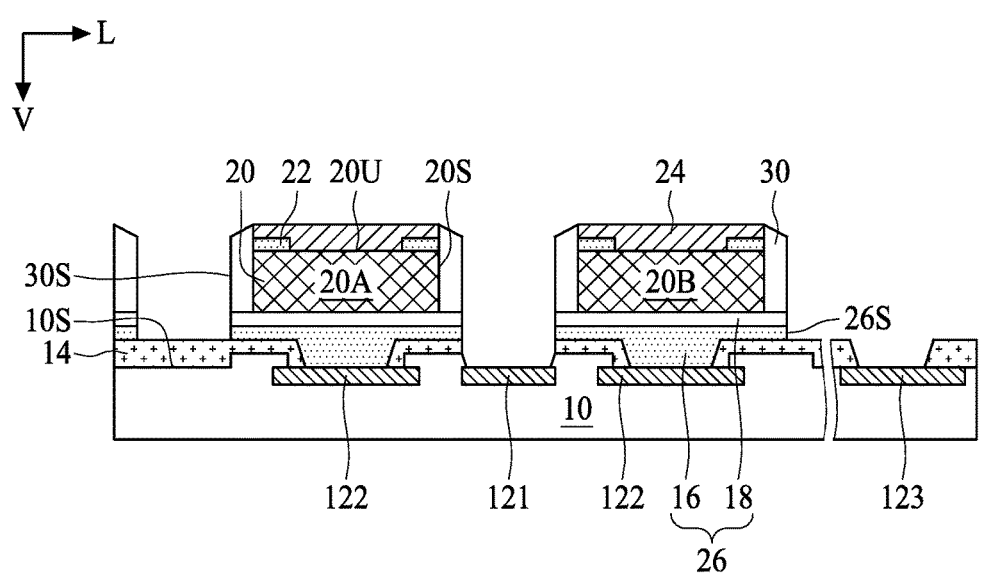

Referring to FIG. 5A and FIG. 5B, the second conductive layer 18 and the first conductive layer 16 exposed from the active devices 20 and the first sidewall spacers 30 are removed to expose the first conductive pads 121 and the bonding pads 123. In some embodiments, the second conductive layer 18 and the first conductive layer 16 are removed by etching operation using the sacrificial layer 24 as a hard mask such that the first conductive pads 121 and the bonding pads 123 are exposed. The second conductive layer 18 and the first conductive layer 16 may be removed by dry etching, wet etching or a combination thereof. After the second conductive layer 18 and the first conductive layer 16 are etched, the segmented first conductive layer 16 and the segmented second conductive layer 18 may be configured as bottom electrodes 26. After the second conductive layer 18 and the first conductive layer 16 are etched, the sidewalls 26S of the bottom electrodes 26 may be exposed.

Figure 6A:
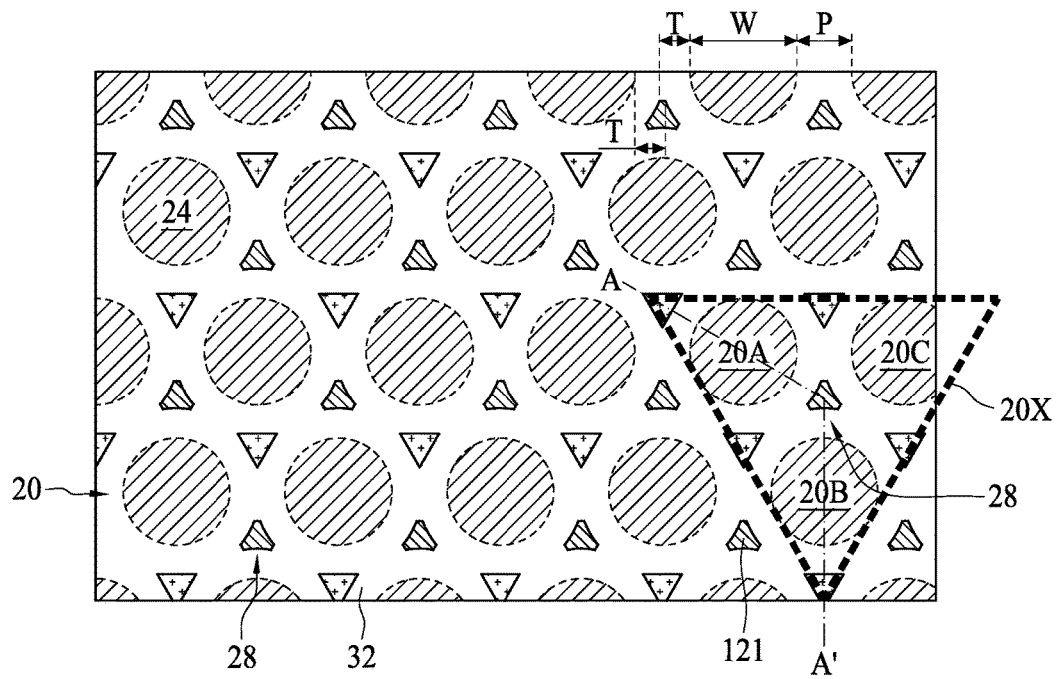
Figure 6B:
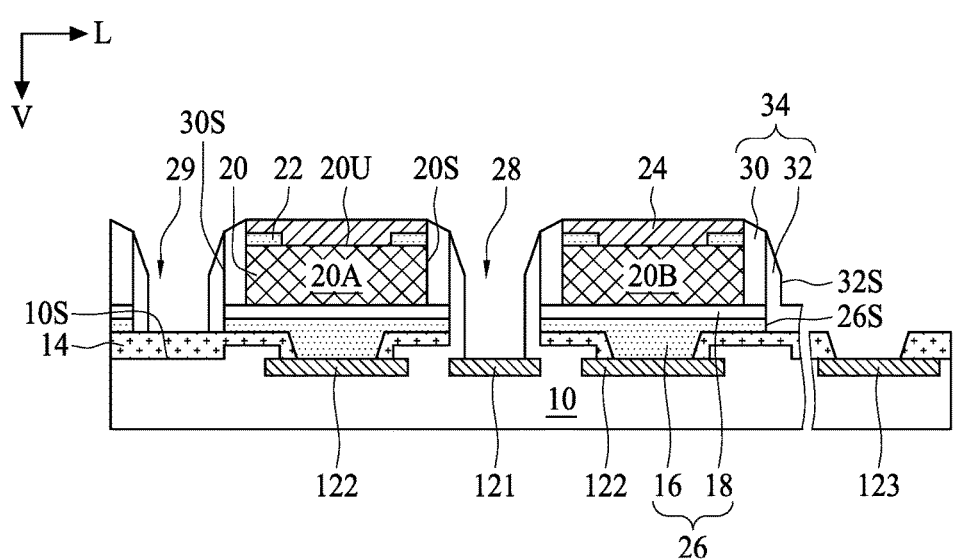

Referring to FIG. 6A and FIG. 6B, a plurality of second sidewall spacers 32 covering the sidewalls 30S of the plurality of first sidewall spacers 30 and the sidewalls 26S of the bottom electrodes 26 are formed. In some embodiments, the second sidewall spacers 32 may be formed by forming a dielectric material over the semiconductor substrate 10 and the first sidewall spacers 30. The dielectric material may be then etched back to form the second sidewall spacers 32, which expose the first conductive pads 121 and the bonding pads 123. The material of the second sidewall spacer 32 may include, but is not limited to, oxides such as silicon oxide and/or hafnium oxide, nitrides such as silicon nitride, oxynitride such as silicon oxynitride, or the like. The second sidewall spacer 32 may have a thinner thickness so as to substantially follow the profile of the first sidewall spacer 30. In some embodiments, the thickness of the second sidewall spacer 32 measured along the lateral direction L is ranging from about 100 angstroms to about 3 micrometers, but the thickness is not limited thereto. A pair of first sidewall spacer 30 and second sidewall spacer 32 together can form a sidewall spacer 34. In some embodiments, the thickness T of the sidewall spacer 34 measured along the lateral direction L is ranging from about 200 angstroms to about 6 micrometers, but the thickness T is not limited thereto.

As shown in FIG. 6A and FIG. 6B, the second sidewall spacer 32 may partially overlap the first conductive pad 121 in a vertical direction V substantially perpendicular to the major surface 10S of the semiconductor substrate 10. After the dielectric material is etched back, a plurality of enclosures 28 are formed, where each enclosure 28 is cooperatively defined by the sidewall spacers 34 of the respective group 20X of active devices 20. The enclosures 28 expose the first conductive pads 121. A plurality of second enclosures 29 may be formed concurrently with the enclosures 28, where each second enclosure 29 is cooperatively defined by the sidewall spacers 34 of the group 20X of the active devices 20 and the sidewall spacers 34 of an adjacent group of active devices 20. In some embodiments, one of the second enclosures 29 and one of the enclosures 28 may be formed on two opposing sides of the same active device 20. For example, the second enclosure 29 and the enclosure 28 are arranged symmetrically with respect to the active device 20. Each first enclosure 28 exposes a respective first conductive pad 121, while the second enclosures 29 expose the insulative layer 14.

The enclosures 28 are formed in a self-aligned manner. In this description, the self-aligned manner represents that the enclosures 28 are defined simultaneously with formation of the sidewall spacers 34. When the sidewall spacers 34 are formed, the enclosures 28 are formed and simultaneously located among the active devices 20A, 20B and 20C. The pitch P between two active devices 20 of the group 20X and the thickness T of the sidewall spacer 34 are configured to form the enclosure 28 in a self-aligned manner. For example, the pitch P between two active devices 20 of the group 20X is less than twice the thickness T of the sidewall spacer 34, such that the sidewall spacers 34 covering the lateral surfaces 20S of two adjacent active devices 20 can be connected. The sidewall spacers 34 among three active devices 20, on the other hand, are not connected, thereby forming the enclosure 28 in a self-aligned manner. Therefore, reduction of the number of required photomask can be achieved. The reduction of photolithography also avoid overlay margin, and thus the pitch between adjacent active devices 20 can be reduced, and the layout density of the active devices 20 can be increased. In some embodiments, a ratio of the thickness T of the sidewall spacer 34 to the width W of the active device 20 measured along the lateral direction L is ranging from about 0.0001 to about 6, but is not limited thereto. By way of example, the ratio of the thickness T of the sidewall spacer 34 to the width W of the active device 20 measured along the lateral direction L is ranging from about 0.0001 to about 3, or ranging from about 0.0002 to about 6.

Figure 7A:
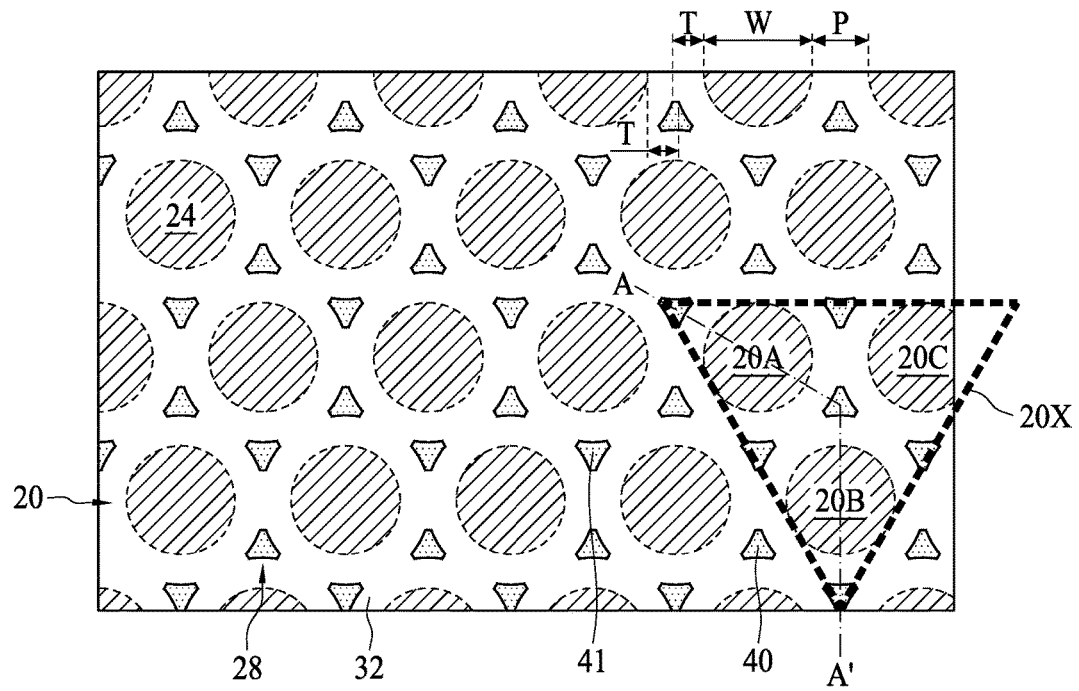
Figure 7B:
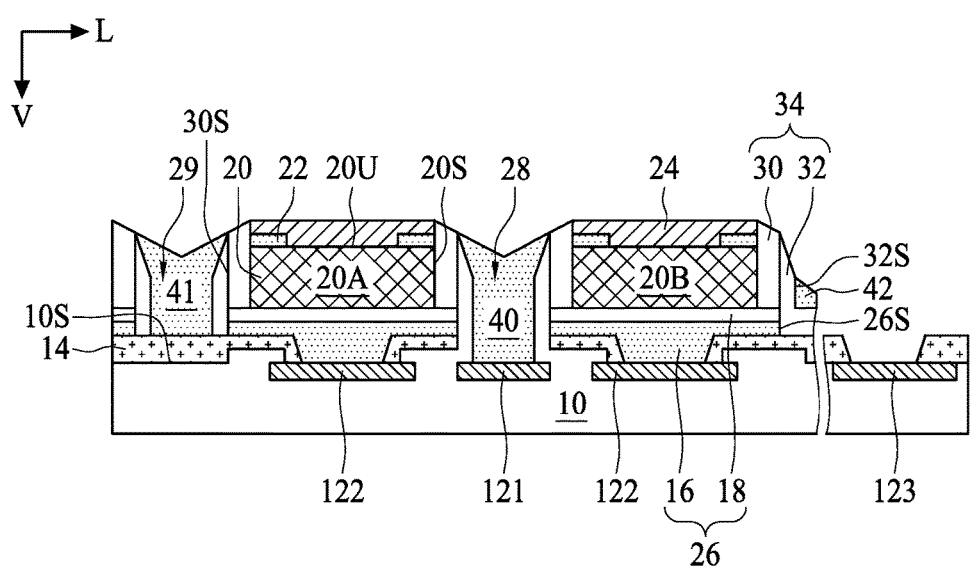

Referring to FIG. 7A and FIG. 7B, a plurality of contact structures 40 are formed in the enclosures 28, and electrically connected to the first conductive pads 121, respectively. The contact structure 40 is configured as a contact via such as a top contact via. In some embodiments, a plurality of dummy contact structures 41, electrically disconnected from the contact structures 40, may be formed in the second enclosures 29 along with the contact structures 40. The dummy contact structure 41 is disposed at an opposing side of the active device 20, i.e., the dummy contact structure 41 and the conductive structure 40 are symmetrically with respect to the active device 20. In some embodiments, formation of the contact structures 40 and the dummy contact structures 41 may omit photolithography operation. In some embodiments, the contact structures 40 and the dummy contact structures 41 are formed by forming a conductive layer over the semiconductor substrate 10. The conductive layer is then etched back to form the contact structures 40 in the enclosures 28 and to form the dummy contact structures 41 in the second enclosures 29.

The conductive layer for forming the contact structures 40 and the dummy contact structures 41 may be removed by dry etching, wet etching or a combination thereof. By way of examples, the material of the conductive layer may include metal such as aluminum, tungsten or the like. In some embodiments, when the material includes aluminum, the dry etching chemistry may include inert gas such as argon gas, and chlorine-based gas such as chlorine gas, boron chloride gas or the like. In some other embodiments, when the material includes tungsten, the dry etching chemistry may include inert gas such as argon gas, and fluorine-based gas. In some embodiments, a glue layer and/or a barrier layer (not shown) may be formed over the first conductive pads 121 prior to formation of the contact structures 40 and the dummy contact structures 41. For example, the glue layer and/or the barrier layer may include a titanium nitride/titanium (TiN/Ti) layer, a tantalum nitride/tantalum (TaN/Ta) layer or other suitable material. The lateral profile of the contact structure 40 and the dummy contact structures 41 is defined by side surface of the sidewall spacer 34 such as the side surface 32S of the second sidewall spacer 32. The cross-sectional profile of the contact structure 40 along the lateral direction L is a non-circular shape. For example, the contact structure 40 includes a substantially triangular planar cross-sectional profile in the lateral direction L when the group 20X includes three active devices 20. The cross-sectional profile of the contact structure 40 may vary depending on the number of active devices 20 in a group 20X. In some embodiments, the width of the contact structure 40 measured along the lateral direction L is ranging from about 1 micrometer to about 10 micrometers, but the width is not limited thereto.

In some embodiments, a conductive sidewall spacer 42 may be formed along with the contact structure 40. The conductive sidewall spacer 42 may be residue of the conductive layer for forming the contact structure 40 after etching back. The conductive sidewall spacer 42 may cover a portion of the sidewall of a sidewall spacer 34 of an active device 20, which is not adjacent to another active device 20. For example, the conductive sidewall spacer 42 may cover a portion of the sidewall 32S of the second sidewall spacer 32. In some embodiments, the conductive layer for forming the contact structure 40 may be disconnected after etching back, and thus the conductive sidewall spacer 42 may be electrically disconnected from the contact structure 40. In some embodiments, the conductive sidewall spacer 42 may not be formed, or may be removed from the second sidewall spacer 32.

Figure 8A:
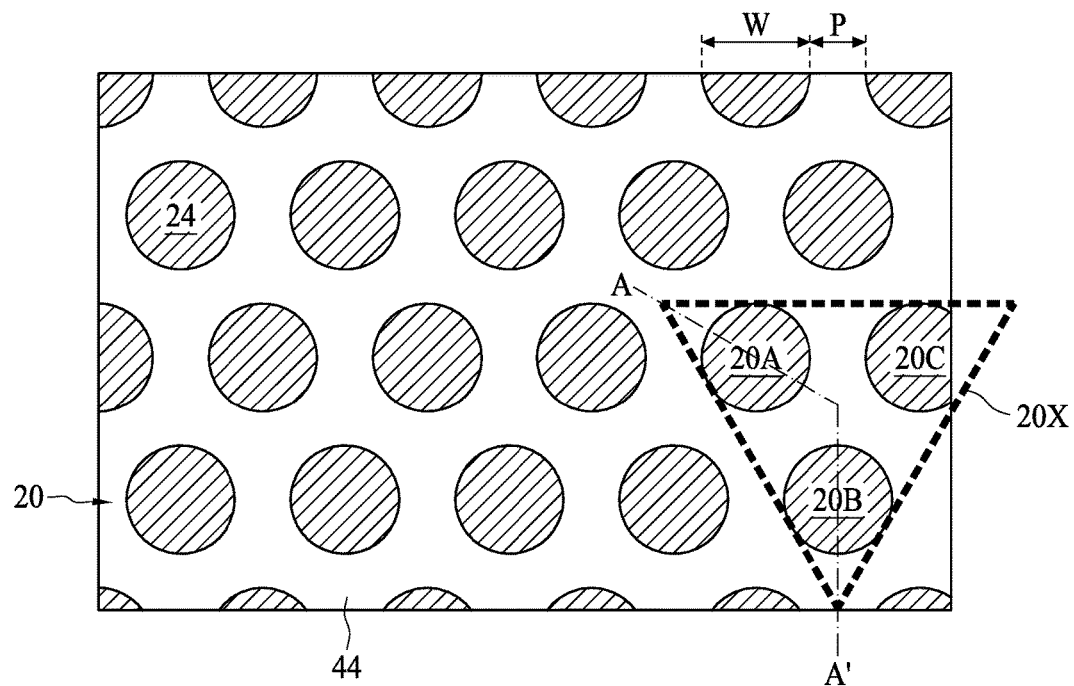
Figure 8B:
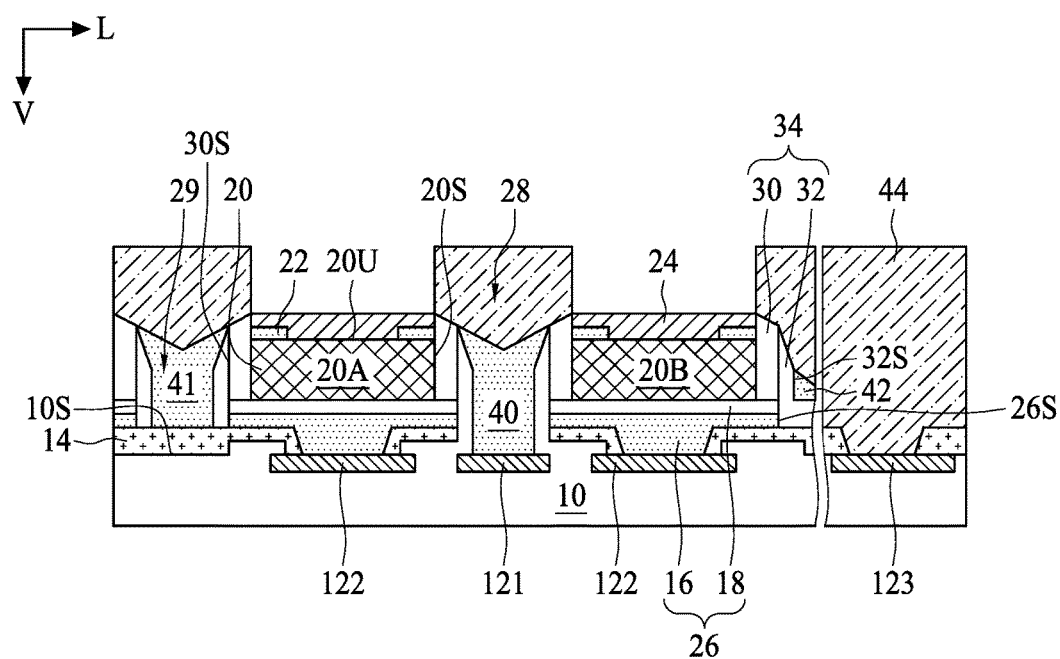
Figure 9A:
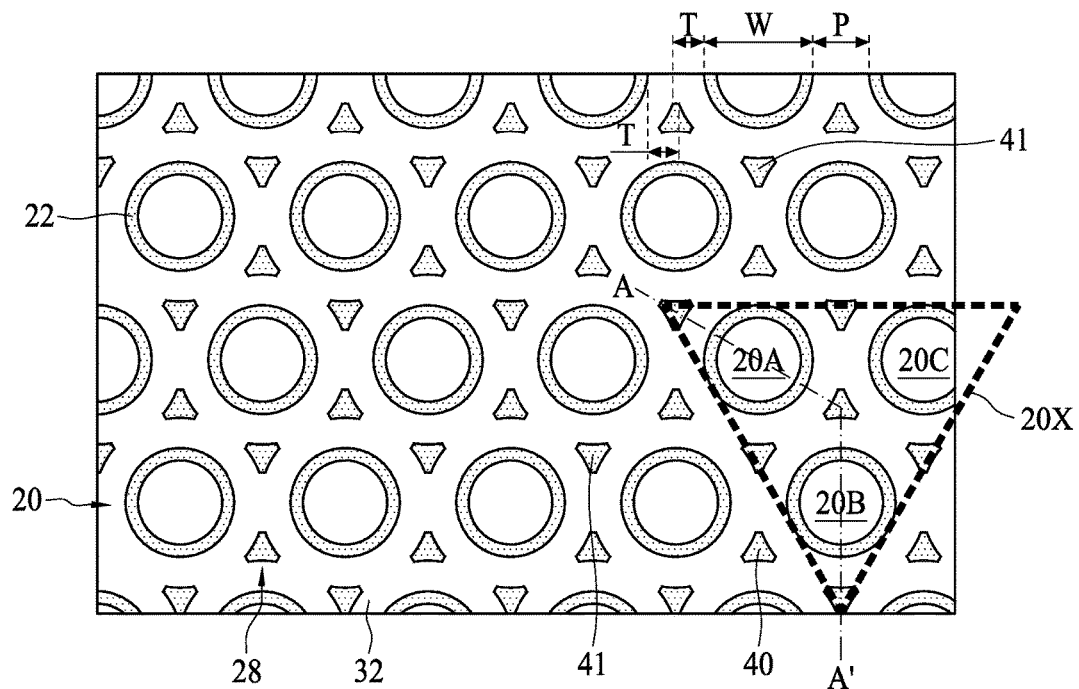
Figure 9B:
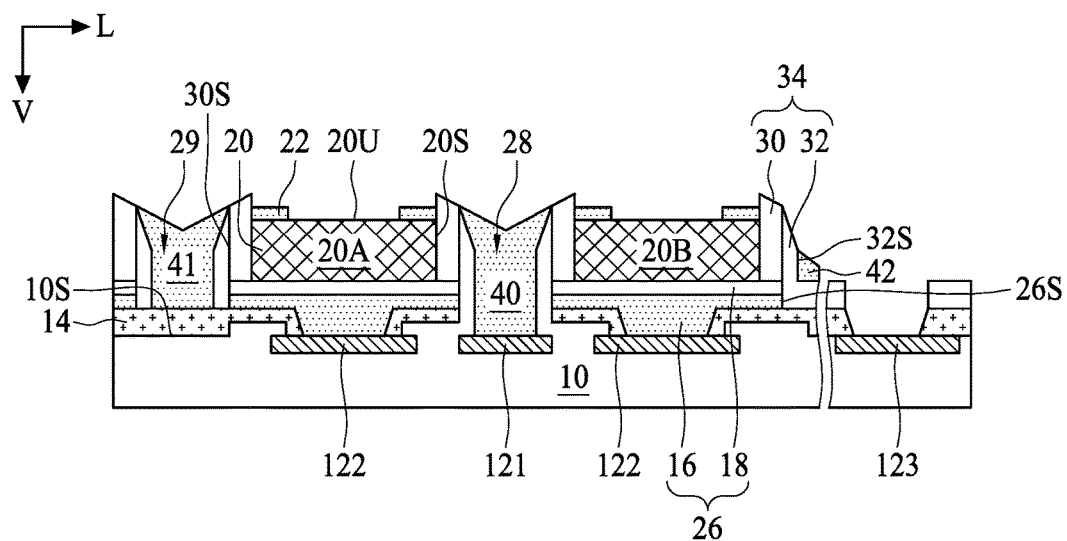

Referring to FIG. 8A and FIG. 8B, a mask layer 44 is formed over the semiconductor substrate 10. The mask layer 44 exposes the sacrificial layer 24 over the upper surface 20U of the active devices 20. Referring to FIG. 9A and FIG. 9B, the sacrificial layer 24 exposed from the mask layer 44 is removed from the upper surface 20U of the active devices 20.

Figure 10A:
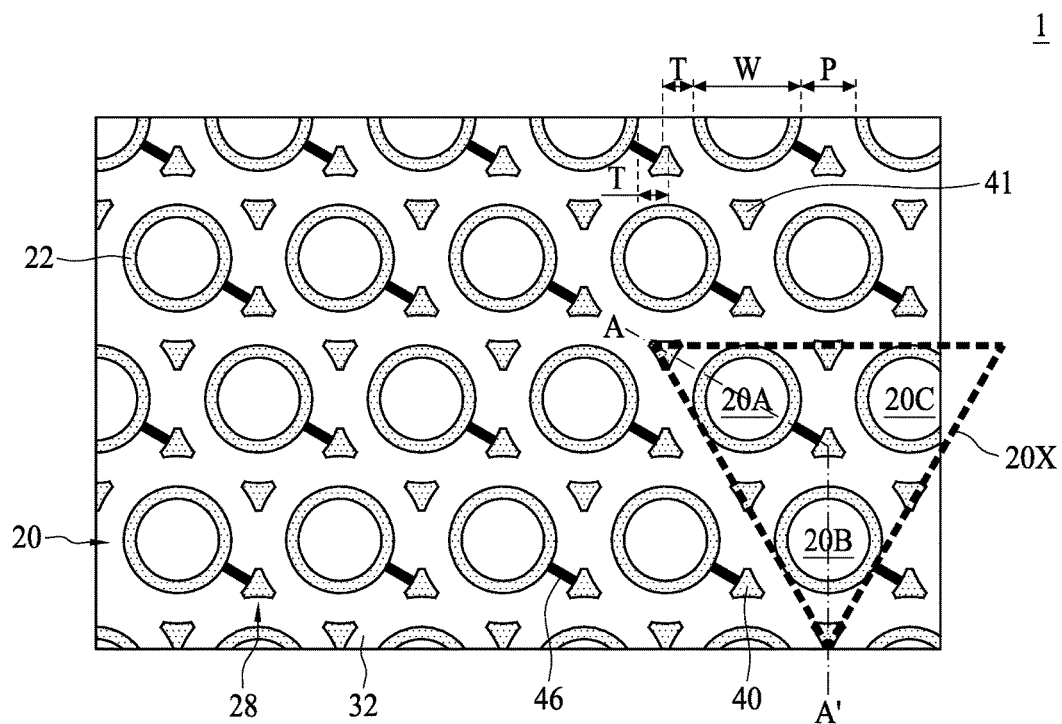
Figure 10B:
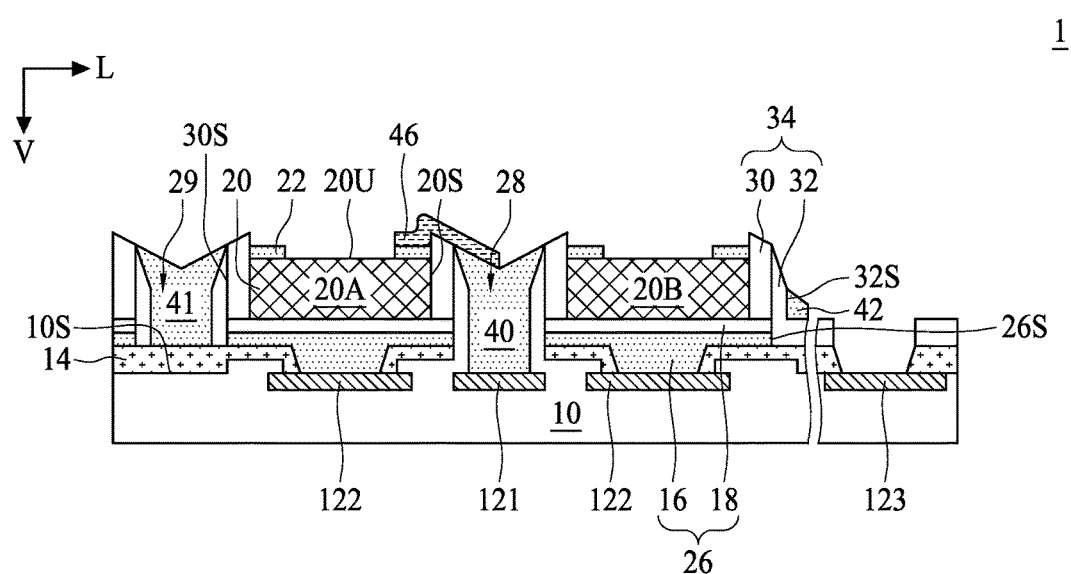

Referring to FIG. 10A and FIG. 10B, a connecting trace 46 is formed to electrically connect one of the plurality of active devices 20 to the respective contact structure 40, thereby forming a semiconductor device 1 of some embodiments of the present disclosure. For example, the connecting trace 46 is electrically connected to the contact structure 40 and the active device 20A of the group 20X. In some embodiments, the connecting trace 46 is electrically connected to the top electrode 22 of the active device 20A at one end, extended over the sidewall spacer 34, and electrically connected to the contact structure 40 at the other end. The dummy contact structure 41, on the other hand, is not covered by the connecting trace 46, and thus is not electrically connected to the top electrode 22 of the active device 20. In some embodiments, the dummy contact structure 41 is floating, and not electrically connected to the active devices 20.

Figure 11A:
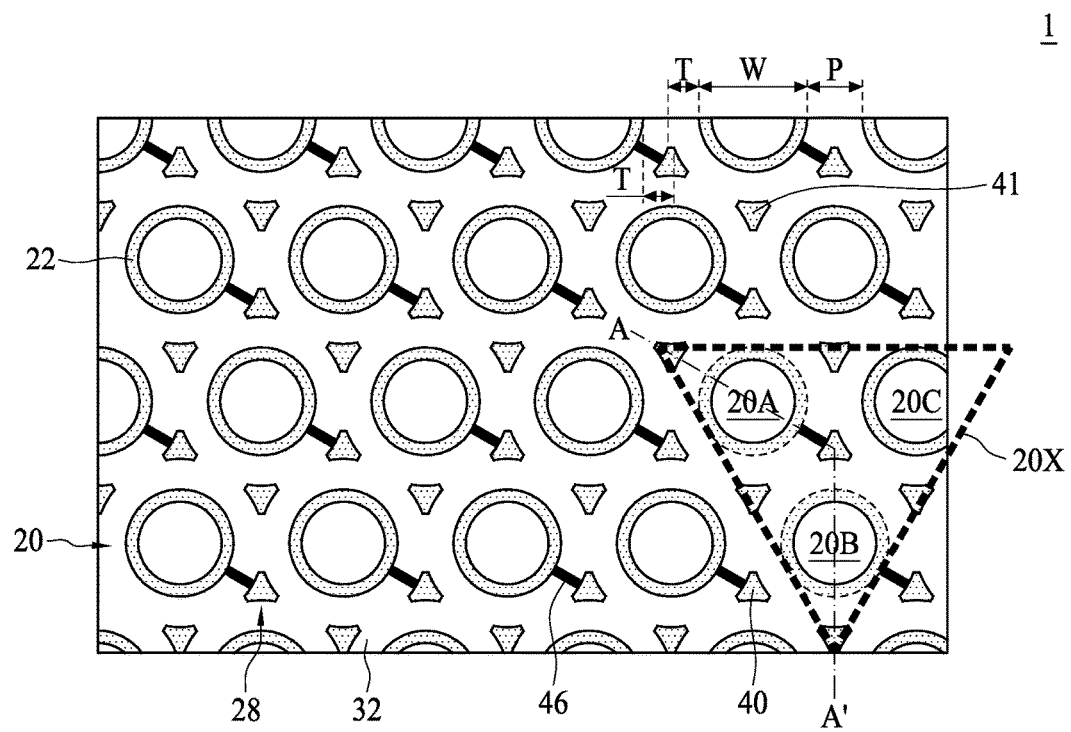
Figure 11B:
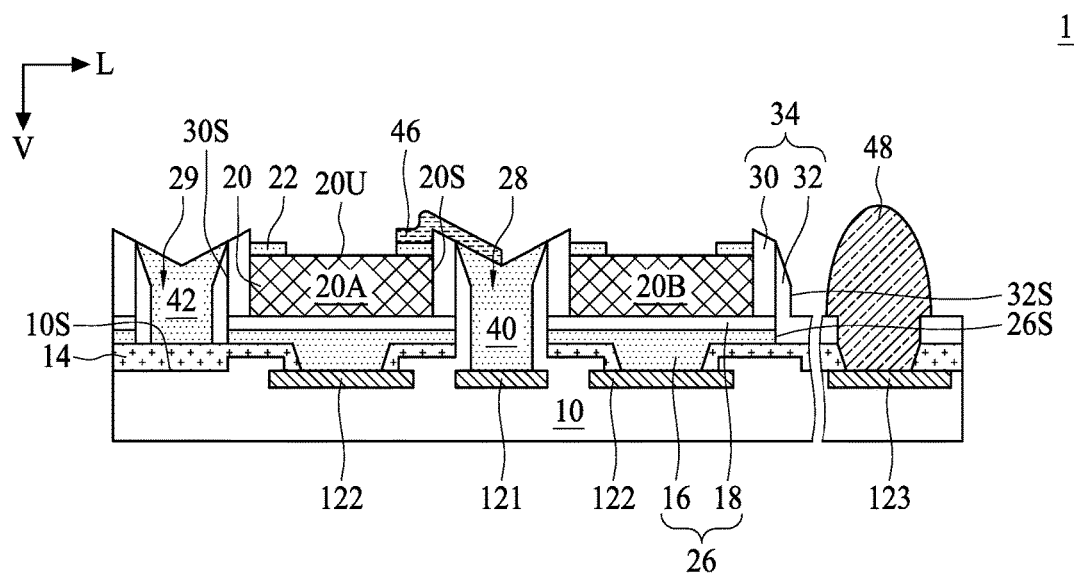

Referring to FIG. 11A and FIG. 11B, in some embodiments, a conductive structure 48 may be formed over the bonding pad 123 for external electrical connection. The conductive structure 48 may be configured to be electrically connected to external electronic component such as printed circuit board (PCB) or the like. In some embodiments, the conductive structure 48 may include, but is not limited to, a conductive bump, a conductive pillar, a conductive post, a combination thereof, or other suitable conductive structures.

The present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 12:
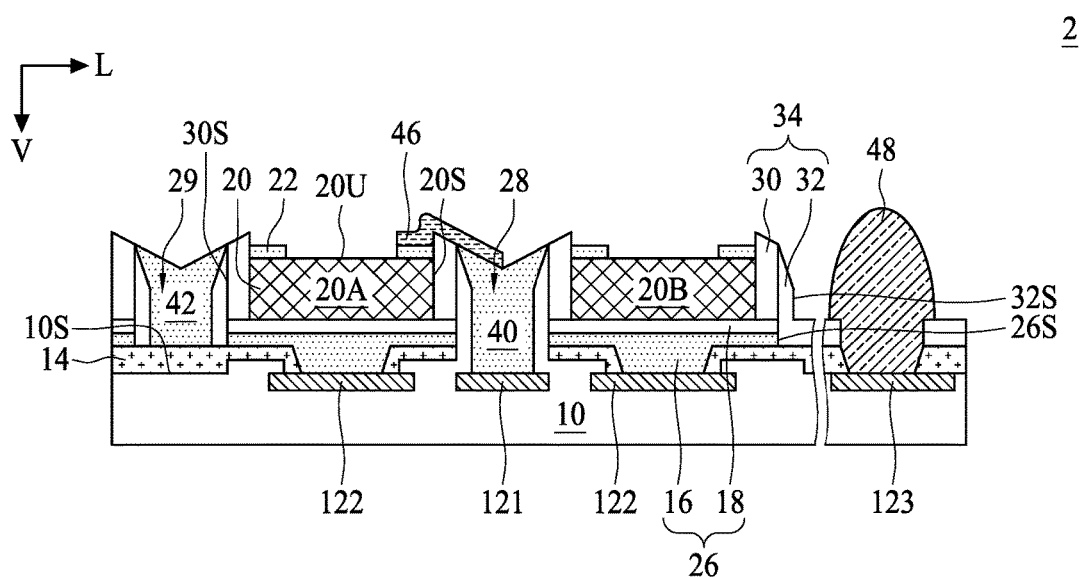
FIG. 12 illustrates a semiconductor device in accordance with one or more embodiments of the present disclosure.

FIG. 12 illustrates a semiconductor device 2 in accordance with one or more embodiments of the present disclosure. Referring to FIG. 12, in contrast to the semiconductor device 1 of FIG. 11B, the conductive sidewall spacer 42 is removed from the sidewall spacer 34.

Figure 13A:
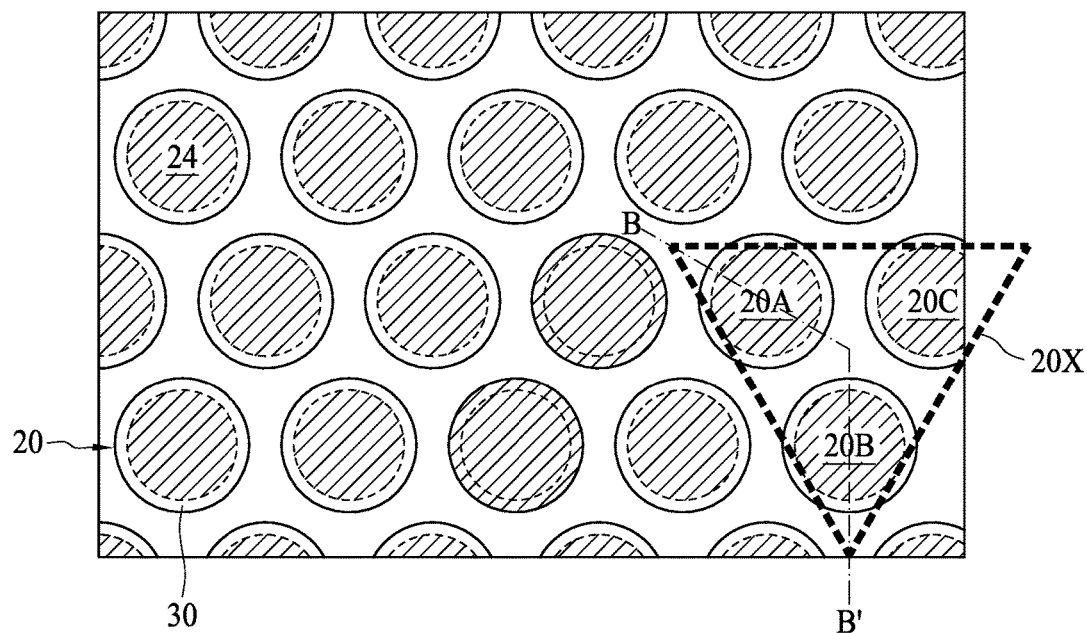
FIG. 13A, FIG. 13B, FIG. 14A, FIG. 14B, FIG. 15A, FIG. 15B, FIG. 16A, FIG. 16B, FIG. 17A and FIG. 17B are schematic views at one of various operations of manufacturing a semiconductor device according to one or more embodiments of the present disclosure.
Figure 13B:
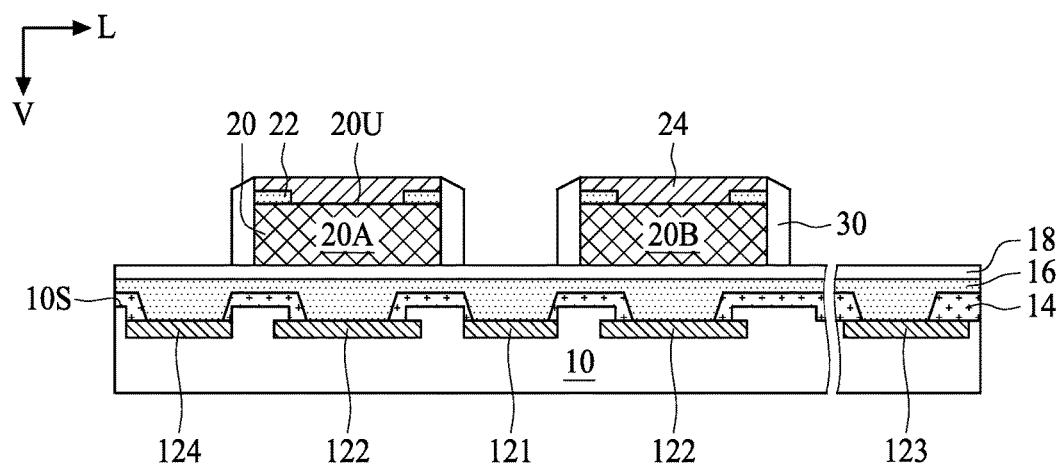

FIG. 13A, FIG. 13B, FIG. 14A, FIG. 14B, FIG. 15A, FIG. 15B, FIG. 16A, FIG. 16B, FIG. 17A and FIG. 17B are schematic views at one of various operations of manufacturing a semiconductor device according to one or more embodiments of the present disclosure, wherein FIG. 13A, FIG. 14A, FIG. 15A, FIG. 16A and FIG. 17A are top views at one of various operations of manufacturing a semiconductor device according to one or more embodiments of the present disclosure, and FIG. 13B, FIG. 14B, FIG. 15B, FIG. 16B and FIG. 17B are cross-sectional views along line B-B' at one of various operations of manufacturing a semiconductor device according to one or more embodiments of the present disclosure. Referring to FIG. 13A and FIG. 13B, a semiconductor substrate 10 is provided. A plurality of conductive pads such as first conductive pads 121, second conductive pads 122, third conductive pads 124 and bonding pads 123 (not shown in top views) may be formed over the semiconductor substrate 10, and electrically connected to the driving devices through the interconnection layer. In contrast to the semiconductor device 1 of FIG. 11B, a pair of the first conductive pad 121 and the third conductive pad 124 are configured to be electrically connected to the same active device 20.

In some embodiments, an insulative layer 14 is formed over the semiconductor substrate 10. The insulative layer 14 is patterned to expose the first conductive pads 121, the second conductive pads 122, the third conductive pads 124 and the bonding pads 123. In some embodiments, one or more conductive layers may be formed over the insulative layer 14, and configured to serve as bottom electrodes. For example, a first conductive layer 16 may be formed over the insulative layer 14, and electrically connected to the first conductive pads 121, the second conductive pads 122, the third conductive pads 124 and the bonding pads 123 exposed from the insulative layer 14. A second conductive layer 18 may be formed over, and electrically connected to the first conductive layer 16.

A plurality of active devices 20 are formed over the semiconductor substrate 10, and electrically connected to the second conductive pads 122 through the second conductive layer 18 and the first conductive layer 16. The pair of the first conductive pad 121 and the third conductive pad 123 is disposed at opposing sides of the respective active device 20. A top electrode 22 may be formed over an upper surface 20U of the active device 20. In some embodiments, the top electrode 22 may be a patterned electrode such that the upper surface 20U of the active device 20 may be exposed from the top electrode 22. By way of example, the top electrode 22 may be a ring-shaped electrode such that the upper surface 20U of the active device 20 is exposed to allow light propagation. In some embodiments, a sacrificial layer 24 such as a hard mask layer may be formed over the active device 20 to cover and protect the upper surface 20U and the top electrode 22 during fabrication.

A plurality of first sidewall spacers 30 covering the lateral surfaces 20S of the plurality of active devices 20 are formed. The material of the first sidewall spacer 30 may include, but is not limited to, oxides such as silicon oxide and/or hafnium oxide, nitrides such as silicon nitride, oxynitride such as silicon oxynitride, or the like. The first spacer structure 30 may have a narrow width so as to substantially follow the profile of the active device 20. In some embodiments, the width of the first sidewall spacer 30 measured along a lateral direction L substantially parallel to the major surface 10S of the semiconductor substrate 10 is ranging from about 100 angstroms to about 3 micrometers, but the width is not limited thereto.

Figure 14A:
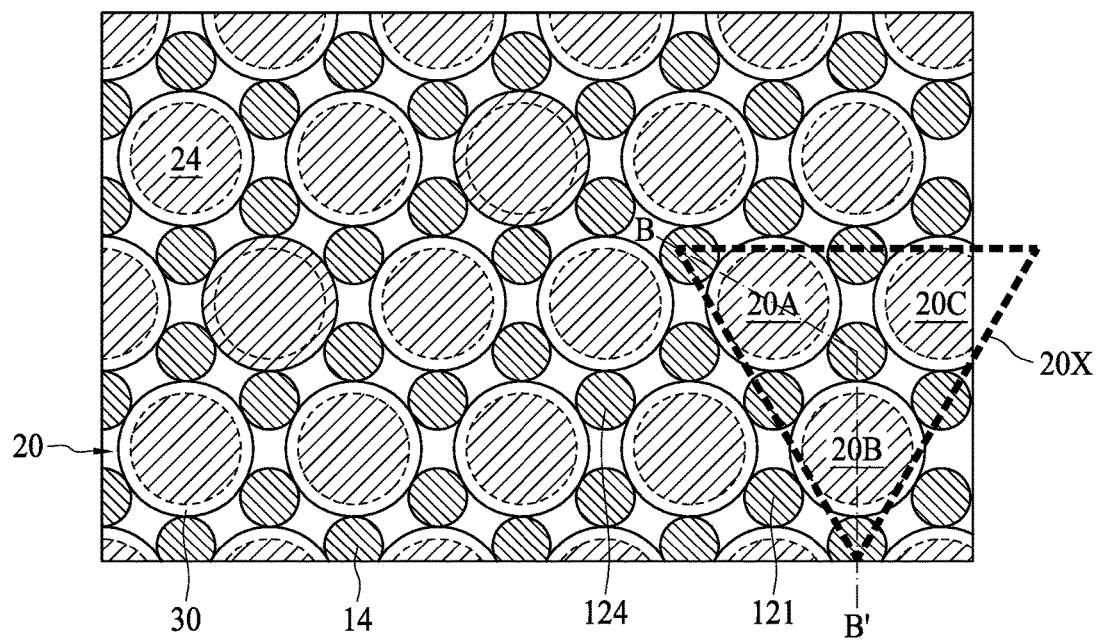
Figure 14B:
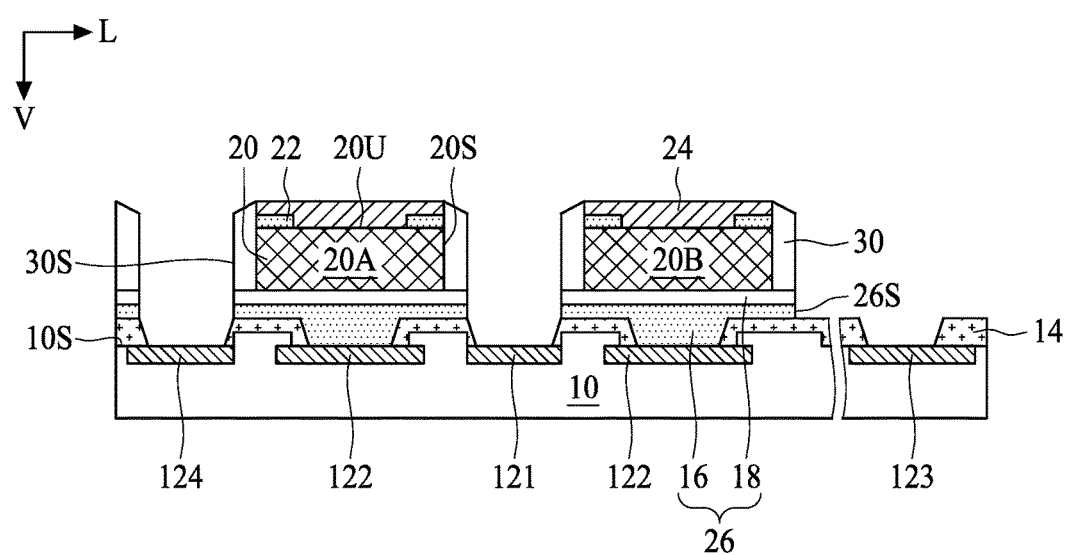

Referring to FIG. 14A and FIG. 14B, the second conductive layer 18 and the first conductive layer 16 exposed from the active devices 20 and the first sidewall spacers 30 are removed to expose the first conductive pads 121, the third conductive pads 124 and the bonding pads 123. In some embodiments, the second conductive layer 18 and the first conductive layer 16 are removed by etching operation using the sacrificial layer 24 as a hard mask such that the first conductive pads 121, the third conductive pads 124 and the bonding pads 123 are exposed. After the second conductive layer 18 and the first conductive layer 16 are etched, the segmented first conductive layer 16 and the segmented second conductive layer 18 may be configured as bottom electrodes 26. After the second conductive layer 18 and the first conductive layer 16 are etched, the sidewalls 26S of the bottom electrodes 26 may be exposed.

Figure 15A:
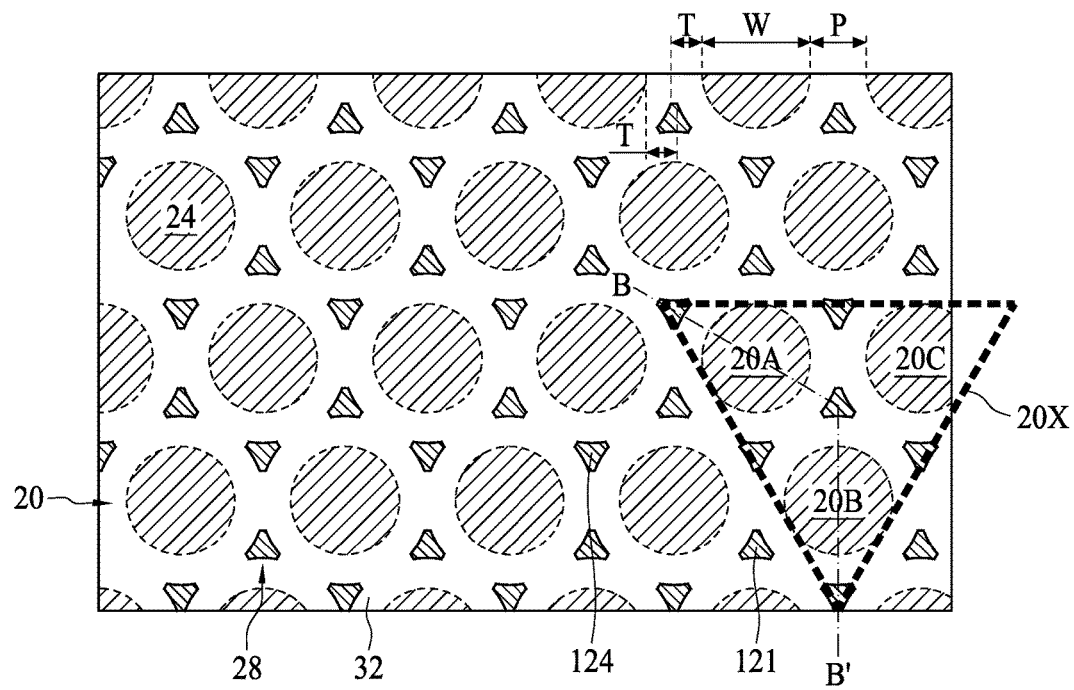
Figure 15B:
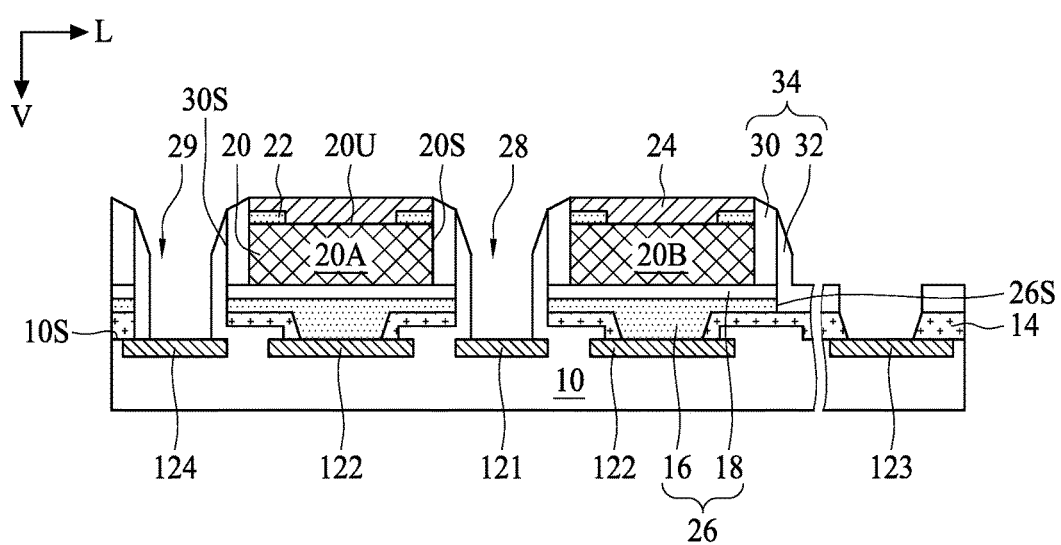

Referring to FIG. 15A and FIG. 15B, a plurality of second sidewall spacers 32 covering the sidewalls 30S of the plurality of first sidewall spacers 30 and the sidewalls 26S of the bottom electrodes 26 are formed. The material of the second sidewall spacer 32 may include, but is not limited to, oxides such as silicon oxide and/or hafnium oxide, nitrides such as silicon nitride, oxynitride such as silicon oxynitride, or the like. The second sidewall spacer 32 may have a narrow width so as to substantially follow the profile of the first sidewall spacer 30. In some embodiments, the width of the second sidewall spacer 32 measured along the lateral direction L is ranging from about 100 angstroms to about 3 micrometers, but the width is not limited thereto. A pair of first sidewall spacer 30 and second sidewall spacer 32 together can form a sidewall spacer.

In some embodiments, the second sidewall spacer 32 may partially overlap the first conductive pad 121 and the third conductive pad 124 in a vertical direction V substantially perpendicular to the major surface 10S of the semiconductor substrate 10. The pitch P between two active devices 20 of the group 20X and the thickness T of the sidewall spacer 34 are configured, such that enclosures 28 and 29 can be formed in a self-aligned manner. For example, the pitch P between two active devices 20 of the group 20X is less than twice the thickness T of the sidewall spacer 34, such that the sidewall spacers 34 covering the lateral surfaces 20S of two adjacent active devices 20 can be connected. The sidewall spacers 34 among three active devices 20, on the other hand, are not connected. Accordingly, after the dielectric material is etched back, a plurality of enclosures 28 and second enclosures 29 defined by the sidewall spacers 34 exposing the first conductive pads 121 and the third conductive pads 124 are formed.

Figure 16A:
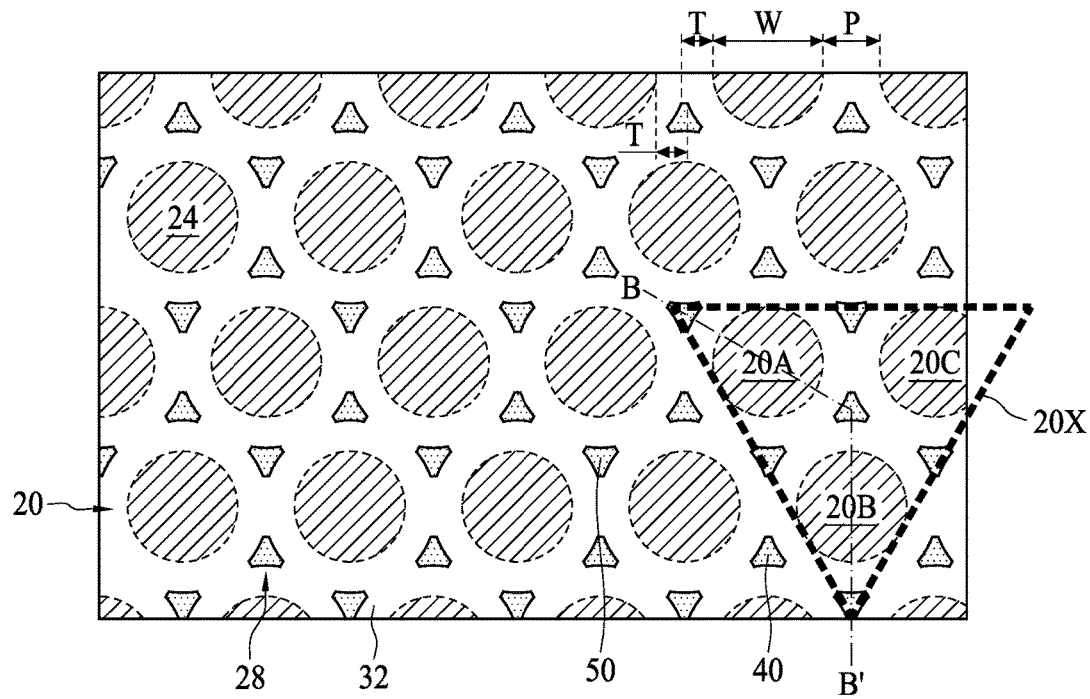
Figure 16B:
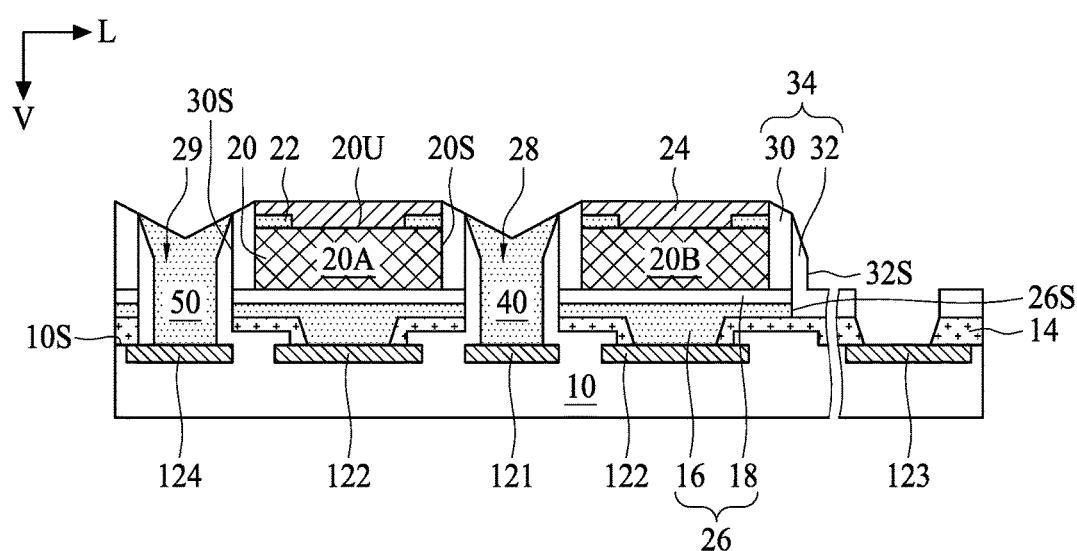

Referring to FIG. 16A and FIG. 16B, a plurality of contact structures 40 are formed in the enclosures 28 and second contact structures 50 are formed in the second enclosures 29. The second contact structures 50 may be disposed at an opposing side of the active device 20 with respect to the first contact structure 40. In some embodiments, the second contact structure 50 and the contact structures 40 are arranged symmetrically with respect to the active device 20.

In some embodiments, a conductive sidewall spacer (not shown) may be formed along with the contact structure 40 and the second contact structures 50. In some embodiments, the conductive sidewall spacer may not be formed, or may be removed from the sidewall spacer 34.

Figure 17A:
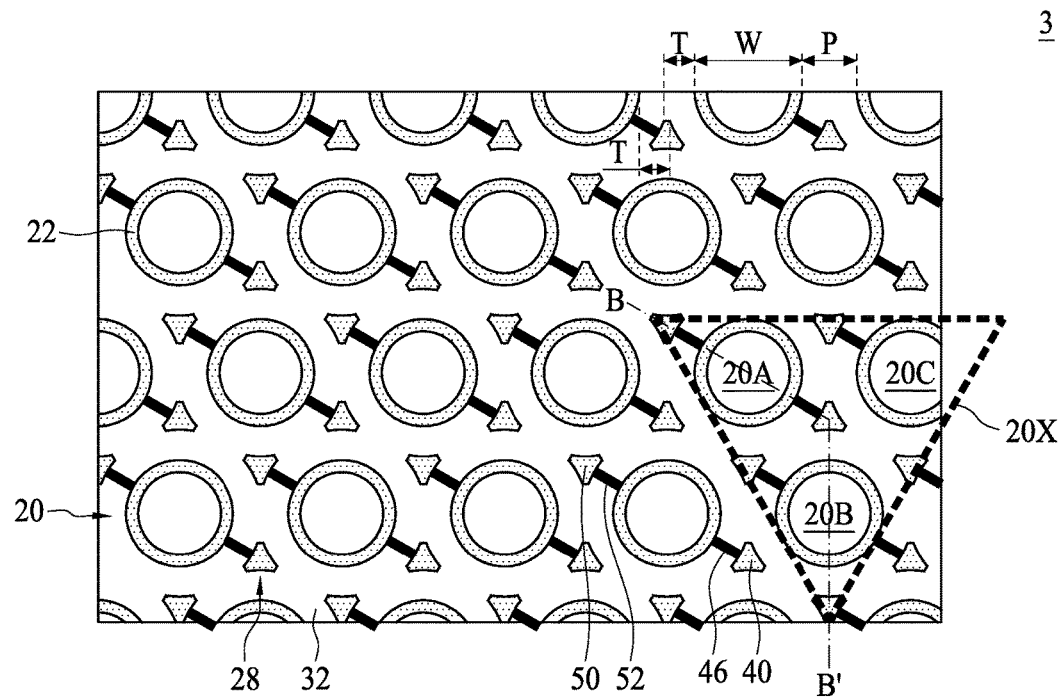
Figure 17B:
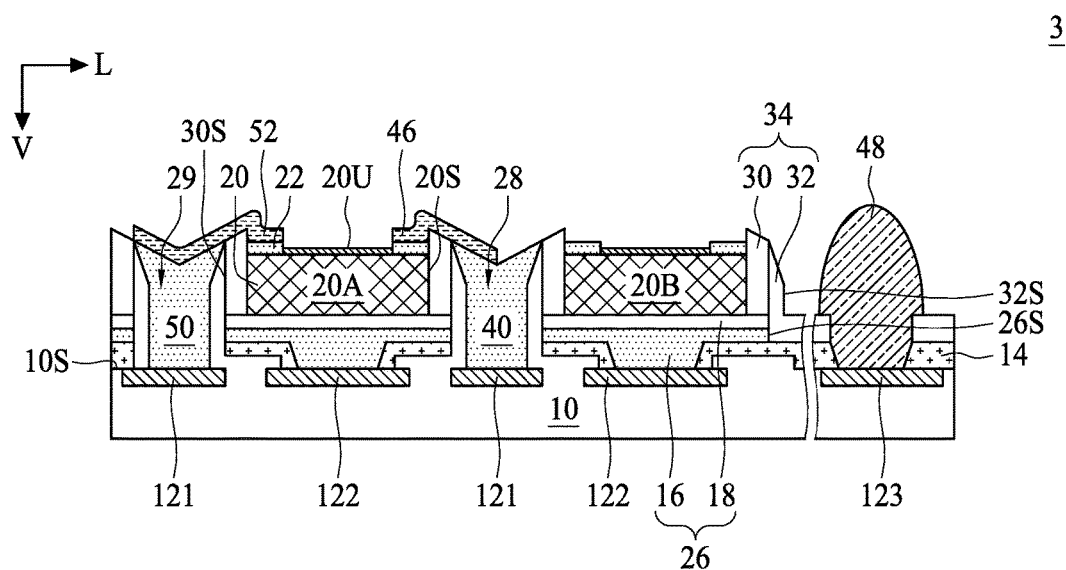

Referring to FIG. 17A and FIG. 17B, a connecting trace 46 is formed to electrically connect one of the plurality of active devices 20 to the respective contact structure 40, and a second connecting trace 52 is formed to electrically connect the same active device 20 to the respective second contact structure 50. Accordingly, a semiconductor device 3 of some embodiments is formed. In some embodiments, a conductive structure 48 may be formed over the bonding pad 123 for external electrical connection.

In some embodiments of the present disclosure, the semiconductor device uses self-aligned contact via(s) to provide an electrical connection path for the active device. The contact via is formed in an enclosure defined by sidewall spacers of several neighboring active devices, and thus can be formed in a self-aligned manner. The self-aligned contact via can reduce the number of photomasks in the fabrication of the semiconductor device, and thus layout density can be increased, and manufacturing costs can be reduced.

In some embodiments, a semiconductor device includes a substrate, a group of devices, a plurality of sidewall spacers and a contact structure. The group of the active devices is arranged over the substrate. The plurality of sidewall spacers are over lateral surfaces of the group of the devices. The sidewall spacers abut one another and cooperatively define an enclosure between the active devices of the group of the active devices. The contact structure is arranged between the devices in the enclosure. The contact structure is electrically connected to one device of the group of the devices.

In some embodiments, a semiconductor device includes an active device, a sidewall spacer, and a contact via. The active device is over a substrate. The sidewall spacer is over a lateral surface of the active device. The contact via is adjacent to the sidewall spacer. The contact via has a substantially triangular planar cross-sectional profile.

In some embodiments, a method for manufacturing a semiconductor device is provided. A substrate is received. A group of active devices is formed over the substrate. A plurality of abutting sidewall spacers that respectively cover lateral surfaces of the active devices are formed, wherein the plurality of sidewall spacers cooperatively define an enclosure therebetween. A contact via is formed in the enclosure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a group of devices arranged over the substrate;
a plurality of sidewall spacers over lateral surfaces of the group of the devices, wherein the sidewall spacers abut one another and cooperatively define an enclosure between the group of the devices; and
a contact structure arranged between the devices in the enclosure, wherein the contact structure is electrically connected to one device of the group of the active devices.

2. The semiconductor device of claim 1, wherein the group of devices comprises three devices, and each of the devices comprises a substantially tubular profile with a substantially circular planar cross-section in a lateral direction parallel to a major surface of the substrate.

3. The semiconductor device of claim 2, wherein the contact structure comprises a substantially triangular planar cross-sectional profile in the lateral direction parallel to the major surface.

4. The semiconductor device of claim 1, wherein the group of devices comprises a plurality of diode devices.

5. The semiconductor device of claim 1, wherein one end of the contact structure distal from the substrate is electrically connected to the one device of the group of the devices.

6. The semiconductor device of claim 5, further comprising a first conductive pad and a second conductive pad over the substrate, wherein the one device of the group of the devices further comprises a bottom electrode near the substrate, and a top electrode distal from the substrate, the other end of the contact structure near the substrate is connected to the first conductive pad, and the bottom electrode is connected the second conductive pad.

7. The semiconductor device of claim 6, further comprising a connecting trace over the top electrode of the one device of the group of the devices and the contact structure, wherein the top electrode of the one device of the group of the devices and the contact structure are connected through the connecting trace.

8. The semiconductor device of claim 1, wherein each of the sidewall spacers has a thickness measured along a lateral direction parallel to a major surface of the substrate, and a pitch measured along the lateral direction between two adjacent devices of the group of the devices is less than twice the thickness of the sidewall spacer.

9. The semiconductor device of claim 8, wherein a ratio of the thickness of the sidewall spacer to a width of the device measured along the lateral direction is ranging from about 0.0001 to about 6.

10. The semiconductor device of claim 1, further comprising a dummy contact structure over the substrate, wherein the dummy contact structure is arranged between the one device of the group of the devices and an adjacent group of devices.

11. A semiconductor device, comprising:
an active device over a substrate;
a sidewall spacer over a lateral surface of the active device; and
a contact via adjacent to the sidewall spacer, wherein the contact via has a substantially triangular planar cross-sectional profile.

12. The semiconductor device of claim 11, wherein the active device comprises a substantially tubular profile with a substantially circular planar cross-section.

13. The semiconductor device of claim 11, wherein the active device comprises a diode device.

14. The semiconductor device of claim 11, further comprising a connecting trace over the active device and the contact via, wherein the active device and the contact via are connected through the connecting trace.

15. The semiconductor device of claim 11, further comprising a dummy contact via adjacent to the sidewall spacer, wherein the dummy contact via and the contact via are arranged symmetrically with respect to the active device, and the dummy contact via is floating.

16. The semiconductor device of claim 11, further comprising a second contact via adjacent to the sidewall spacer, wherein the second contact via and the contact via are arranged symmetrically with respect to the active device, and the second contact via is connected to the active device.

17. A semiconductor device, comprising:
a substrate;
a plurality of devices arranged over the substrate;
a dielectric layer over lateral surfaces of the plurality of devices;
a contact structure in the dielectric layer and between the plurality of devices, wherein an end of the contact structure is exposed from a surface of the dielectric layer; and
a connecting trace over the dielectric layer, and electrically connecting to the end of the contact structure to one of the plurality of devices.

18. The semiconductor device of claim 17, wherein the contact structure has a substantially triangular planar cross-sectional profile.

19. The semiconductor device of claim 17, wherein the device comprises a substantially tubular profile with a substantially circular planar cross-section.

20. The semiconductor device of claim 17, further comprising a dummy contact structure in the dielectric layer, wherein the dummy contact structure and the contact structure are arranged symmetrically with respect to the device electrically connected to the connecting trace, and the dummy contact structure is floating.

* * * * *